(12) United States Patent
O'Neill et al.

(10) Patent No.: US 10,162,022 B2
(45) Date of Patent: Dec. 25, 2018

(54) LOW COST MAGNETIC RESONANCE SAFE TOUCHSCREEN DISPLAY

(71) Applicant: KONINKLIJKE PHILIPS N.V., Eindhoven (NL)

(72) Inventors: Francis Patrick O'Neill, Kissimmee, FL (US); Ronald Paul Consiglio, Clermont, FL (US); Donald Alan Forrer, Orlando, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 236 days.

(21) Appl. No.: 15/103,322

(22) PCT Filed: Dec. 10, 2014

(86) PCT No.: PCT/IB2014/066741
§ 371 (c)(1),
(2) Date: Jun. 10, 2016

(87) PCT Pub. No.: WO2015/087243
PCT Pub. Date: Jun. 18, 2015

(65) Prior Publication Data
US 2016/0320463 A1 Nov. 3, 2016

Related U.S. Application Data

(60) Provisional application No. 61/915,540, filed on Dec. 13, 2013.

(51) Int. Cl.
*G01R 33/28* (2006.01)
*G01R 33/54* (2006.01)
*G06F 3/045* (2006.01)

(52) U.S. Cl.
CPC ......... *G01R 33/283* (2013.01); *G01R 33/543* (2013.01); *G06F 3/045* (2013.01);
(Continued)

(58) Field of Classification Search
CPC ..... G01R 33/283; G01R 33/543; G06F 3/045; G06F 2203/04103; G06F 2203/04107
(Continued)

(56) References Cited

U.S. PATENT DOCUMENTS 6,897,919 B2   5/2005  Enomoto
7,848,788 B2 * 12/2010  Tulley .............. G01R 33/34053
                                                        324/318
(Continued)

FOREIGN PATENT DOCUMENTS

| KR | 101271012 | 6/2013 |
| WO | 2008/098361 | 8/2008 |
| WO | 2011112214 | 9/2011 |

OTHER PUBLICATIONS

Tam, et al., "A new tablet for writing and drawing during functional MRI", Human Brain Mapping, vol. 32, No. 2, Mar. 24, 2010.
(Continued)

*Primary Examiner* — Giovanni Astacio-Oquendo

(57) ABSTRACT

A magnetic resonance (MR) safe touchscreen display (10) includes a touchscreen (16) and a film (30, 32) that has a high frequency shielding layer (20, 28) and a low frequency shielding layer (18, 26). A bus bar (14) conductively couples the low frequency shielding layer (18, 26) to the high frequency shielding layer (20, 28) around a perimeter of a face of the film (30, 32) and the edge of the film (30, 32). The film (30, 32) is adjacent to a rear face of the touchscreen (16). The bus bar (14) facilitates the connection of the touchscreen (16) and layers (18, 20) to the display (12) to form a Faraday cage around the display components contained within the display housing (11).

14 Claims, 6 Drawing Sheets

Figure 2A:
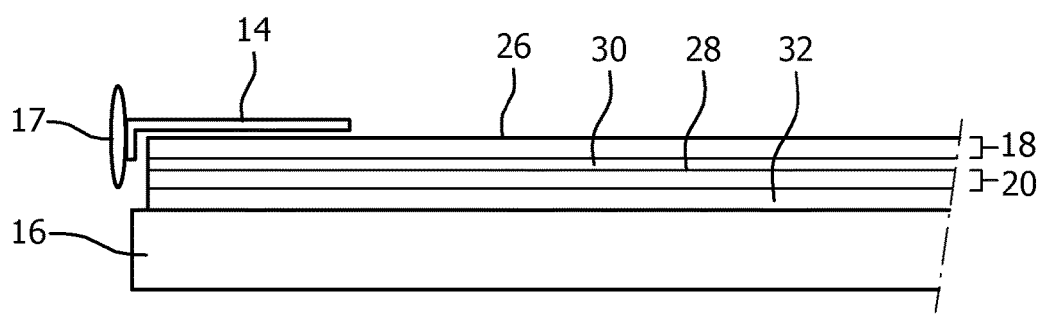

(52) U.S. Cl.
CPC .............. *G06F 2203/04103* (2013.01); *G06F 2203/04107* (2013.01)

(58) Field of Classification Search
USPC ........................................................ 324/322
See application file for complete search history.

(56) References Cited

U.S. PATENT DOCUMENTS

| | | | |
|---|---|---|---|
| 7,948,743 B2 | 5/2011 | Kim | |
| 8,416,162 B2 | 4/2013 | Lee | |
| 9,991,716 B2* | 6/2018 | Cutright | .............. G05B 19/048 |
| 9,992,855 B2* | 6/2018 | Larroux | ................... H05G 1/58 |
| 2005/0036087 A1 | 2/2005 | Mai | |
| 2009/0093705 A1* | 4/2009 | Vangdal | ................. A61B 5/055 |
| | | | 600/410 |
| 2010/0201647 A1 | 8/2010 | Verweg | |
| 2010/0220074 A1* | 9/2010 | Irvin, Jr. | ................. G06F 3/045 |
| | | | 345/174 |
| 2011/0102347 A1 | 5/2011 | Lim | |
| 2012/0253172 A1* | 10/2012 | Loeffler | ............... A61N 5/1049 |
| | | | 600/411 |
| 2012/0299869 A1* | 11/2012 | Hung | .................... G06F 3/0416 |
| | | | 345/174 |
| 2016/0098115 A1* | 4/2016 | Ren | .................. H01L 31/02325 |
| | | | 345/174 |
| 2016/0373864 A1* | 12/2016 | Hecht | ................... G06F 1/1688 |
| 2017/0135229 A1* | 5/2017 | Sebastian | ............... H05K 3/467 |
| 2017/0319097 A1* | 11/2017 | Amthor | .................. A61B 5/055 |

OTHER PUBLICATIONS

Buchenberg W B et al: "Development of a hybrid MR-US system for the assessment of cardiac function during free breathing", Proceedings of the International Society for Magnetic Resonance in Medicine, ISMRM, 20th Annual Meeting and Exhibition, Melbourne, Australia, May 5-11, 2012, Apr. 21, 2012 (Apr. 21, 2012), p. 85, XP040575216.

* cited by examiner

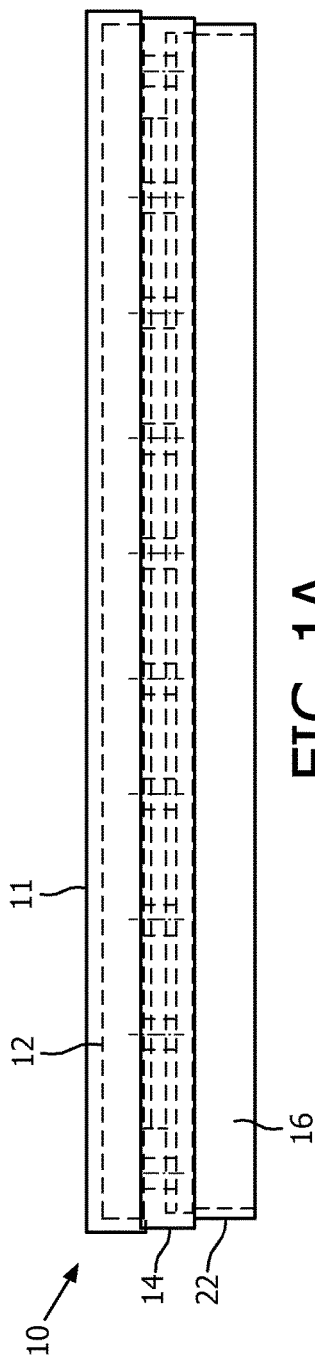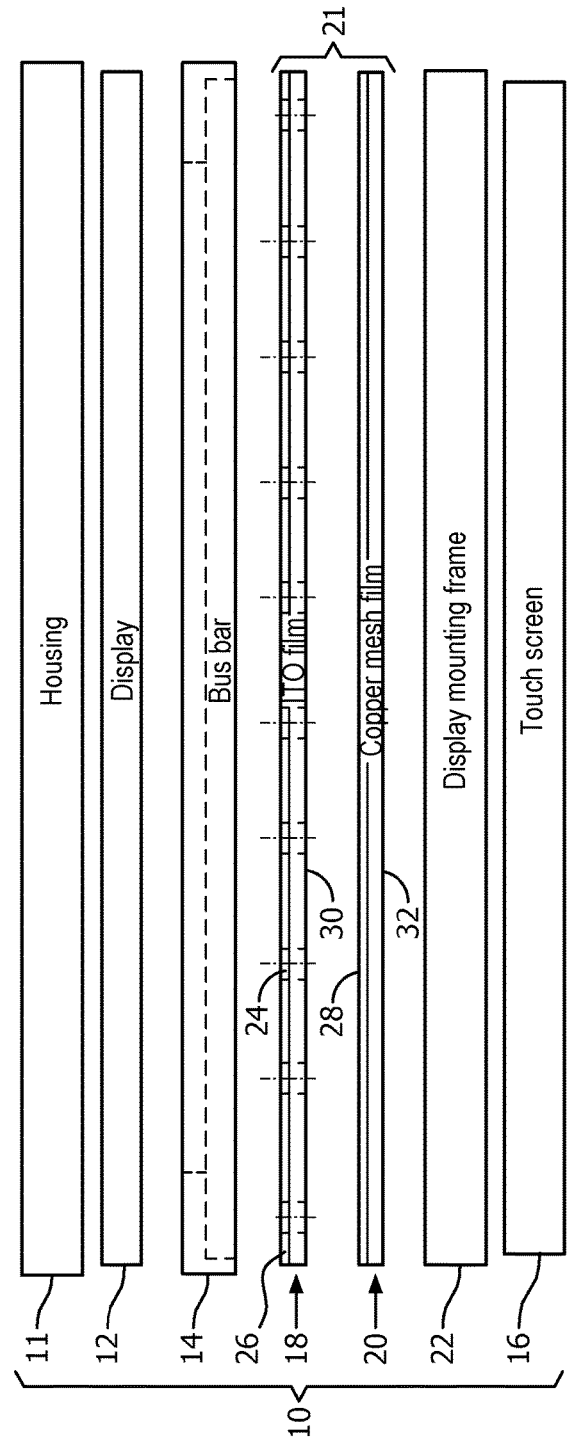
FIG. 1A
FIG. 1B

LOW COST MAGNETIC RESONANCE SAFE TOUCHSCREEN DISPLAY

CROSS REFERENCE TO RELATED APPLICATIONS

This application is the U.S. National Phase application under 35 U.S.C. § 371 of International Application No. PCT/1132014/066741, filed Dec. 10, 2014, published as WO 2015/087243 on Jun. 18, 2015, which claims the benefit of U.S. Provisional Patent Application No. 61/915,540 filed Dec. 13, 2013. These applications are hereby incorporated by reference herein.

The following relates generally to accessories compatible with magnetic resonance (MR) imaging. It finds particular application in conjunction with shielded displays operable in an MR operating environment, and will be described with particular reference thereto. However, it will be understood that it also finds application in other usage scenarios and is not necessarily limited to the aforementioned application.

Magnetic Resonance (MR) technicians are requiring ever increasing diagnostic details and enhanced monitoring information on patient monitoring devices. MR monitoring is becoming more common, and responding to patient needs is becoming more critical. The need for this increase in patient information combined with improvements in display and touch panel technology has moved the industry toward larger displays and improved interfaces.

Monitors and other devices that are used in the MR environment must be operated by clinicians wearing gloves. In the MR environment, various types of touchscreen user interface displays cannot be used. For example, personnel operating MRI devices, meeting with patients, etc., wear gloves, frequently wash hands, etc. Capacitive touchscreens, commonly used on most computers, tablets, and cellular telephones, present problems in that the touch of the user acts to complete the circuit, requiring the user to utilize a special stylus, special glove, or be bare-skinned. Furthermore, such a touchscreen produces a not insubstantial amount of electromagnetic interference (EMI). Accordingly, a touchscreen user interface becomes problematic if resistive technology is not utilized due to the need for gloved or stylus operation. Due to certain sealing requirements, the need for a resistive technology touchscreen typically causes the design of the monitor to be larger and heavier.

In addition, the MR environment, however, requires substantial shielding on the displays used, due to the extremely high levels of EMI across the frequency spectrum. Furthermore, EMI noise emitted from and through these screens by internal display noise sources must be extremely low to avoid negatively impacting operations of the MRI machine. That is, the use of resistive touch technology in combination with stringent EMI requirements results in a difficult EMI shielding design due to the location of the active elements of the touch technology. Accordingly, as the MRI machine functions by sensing the electrical waves generated by the reorientation of atoms within the body, any significant source of EMI in the room while the MRI machine is running will cause degradation of the image produced by the MRI machine.

Typically, on the small displays currently in use, e.g., displays less than 22.5 cm (9 inches) on the diagonal, stainless steel meshes are utilized to achieve adequate shielding. This stainless steel shielding results in high light loss. No secondary shield layer is required in these applications. Scale up of these designs is not possible as the loss generated by the screen can drop by 30 db, resulting in insufficient screening, i.e., EMI leakage. Furthermore, these small screens also have lower EMI gasketing requirement than larger screens. In addition, displays, particularly such small displays, require a separate environmental seal that requires a bezel, i.e., an edge seal is not possible with this design. The presence of such a required bezel hinders effective cleaning procedures in the healthcare setting. In addition to the foregoing, transmitted noise, i.e., EMI, is a function of the sum of all individual openings. This sum increases with the square of screen size.

Current approaches to shielding displays for EMI use sheets of protective material that rely on individual wires to terminate the shield to the housing. Unfortunately, this level of termination does not produce the sufficient shielding for an MRI environment. Thus, current touchscreen displays are small devices that are expensive and difficult to produce.

The following discloses a new and improved low cost magnetic resonance safe touchscreen display which addresses the above referenced issues, and others.

In accordance with one aspect, a magnetic resonance (MR) safe touchscreen display, includes a touchscreen and a film that has a high frequency shielding layer and a low frequency shielding layer. The MR safe touchscreen display also includes a bus bar that conductively couples the high frequency shielding layer to the low frequency shielding layer around a perimeter of a face of the film and a corresponding edge thereof, with the film adjacent to a rear face of the touchscreen.

In accordance with another aspect, a method of manufacturing a magnetic resonance (MR) safe touchscreen display includes laminating a low frequency shielding layer film onto a high frequency shielding layer film to form a laminated film. The method also includes etching the bus bar through the low frequency shielding layer to the high frequency shielding layer, and applying a bus bar to the laminated film around a perimeter of the laminated film corresponding to the low frequency shielding layer to form a conductive coupling between the low frequency shielding layer to the high frequency shielding layer. In addition, the method includes attaching the etched laminated film to a touchscreen adjacent the high frequency shielding layer and to a display component adjacent the low frequency shielding layer.

In accordance with another aspect, a magnetic resonance (MR) safe touchscreen display includes a display mounting frame and a touchscreen disposed within the display mounting frame. The MR safe touchscreen display further includes a laminated film that is positioned adjacent the touchscreen and in contact with the display mounting frame and the touchscreen. The laminated film includes a high frequency shielding layer and a low frequency shielding layer, and also has a plurality of etchings that are disposed along a perimeter of the film and which extend through the low frequency shielding layer to the high frequency shielding layer. The MR safe touchscreen display also includes a bus bar that conductively couples the low frequency shielding layer to the high frequency shielding layer via the etchings, and the display mounting frame along an edge of the perimeter of the laminated film.

One advantage is a touchscreen display capable of operations in an MR environment that is larger and better shielded for reducing electromagnetic interference emanations.

Another advantage resides in embodiments without a bezel to enable easier cleaning.

Another advantage resides in patient monitoring in a strong MR field.

Another advantage resides in adaptability via a touchscreen lacking mechanical switches.

Another advantage resides in an ability to shield internal components of a display while allowing use of a touchscreen interface.

Another advantage resides in an environmentally sealed large MR safe touchscreen display.

Another advantage resides in a low cost of production and ease of manufacture.

Another advantage resides in the ease in scaling a high and low frequency shielding laminate film in accordance with a desired size of a display.

Another advantage resides in an increased display brightness, reduced power consumption, and exclusion of ferromagnetic content in an MR safe touchscreen display.

Another advantage resides in an increased transmissivity of the MR safe touchscreen display.

Still further advantages will be appreciated to those of ordinary skill in the art upon reading and understanding the following detailed description.

The invention may take form in various components and arrangements of component, and in various steps and arrangement of steps. The drawings are only for purposes of illustrating the preferred embodiments and are not to be construed as limiting the invention.

FIG. 1A schematically illustrates an assembled side view of an embodiment of an MR safe touchscreen display.

FIG. 1B schematically illustrates an expanded side view of an embodiment of the MR safe touchscreen display.

FIG. 2A schematically illustrates a sectional view of a corner including a seal component of an embodiment of the MR safe touchscreen display.

Figure 2B:
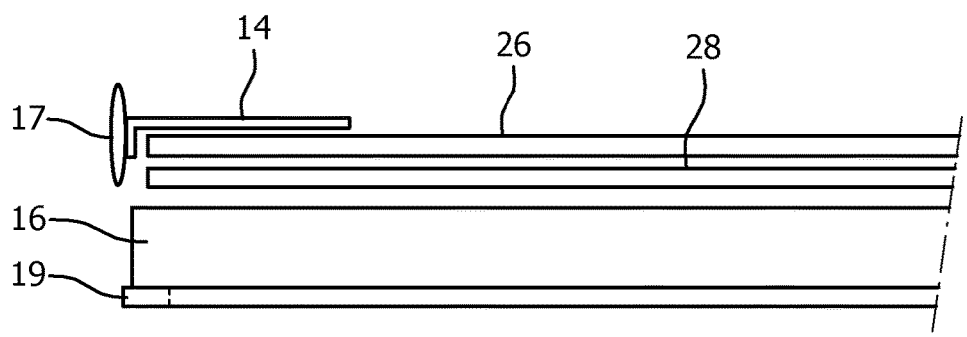

FIG. 2B schematically illustrates a sectional view of a corner including a bezel component of an embodiment of the MR safe touchscreen display.

Figure 3:
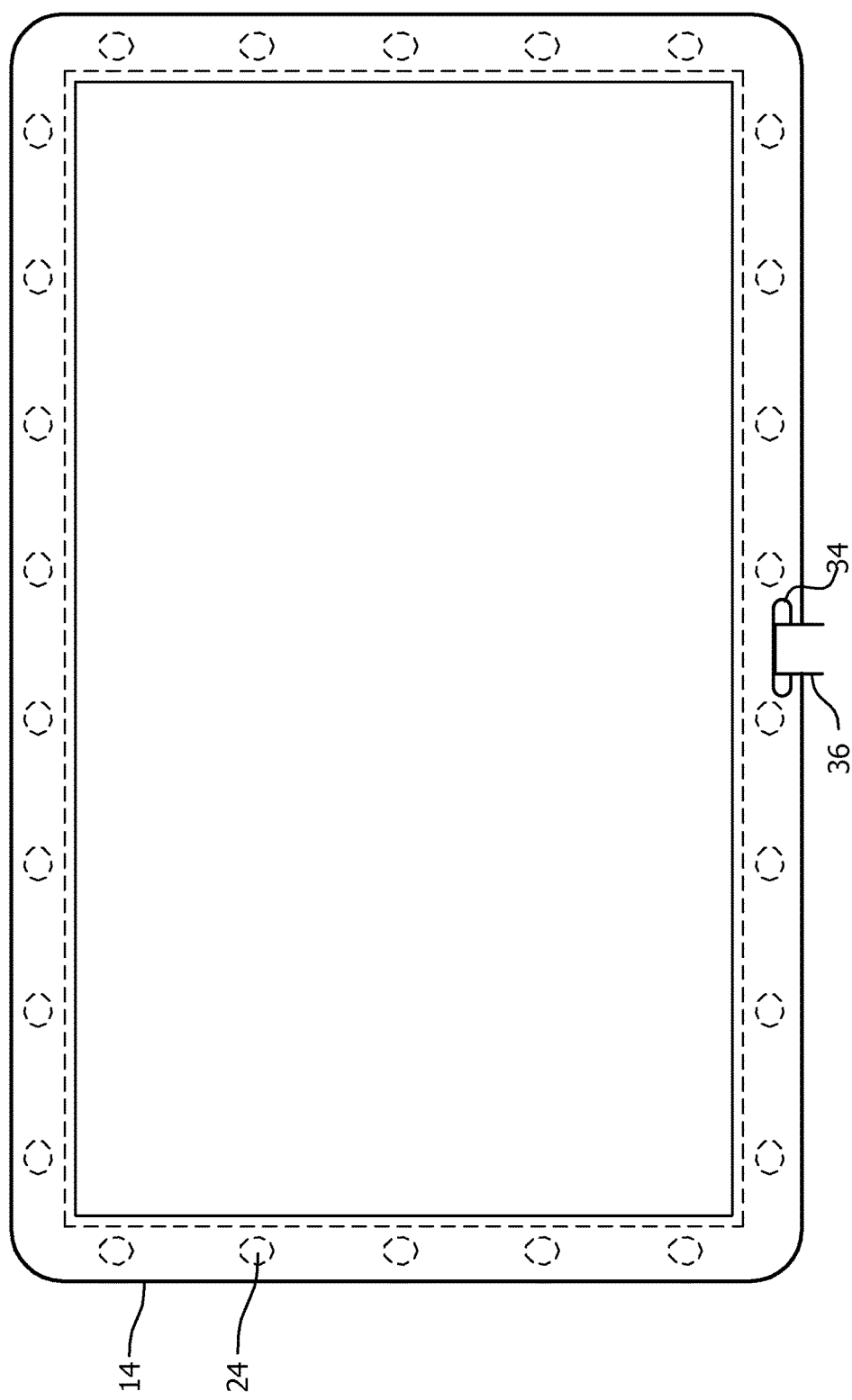

FIG. 3 schematically illustrates a rear view of a bus bar coupled to an embodiment of the MR safe touchscreen display.

Figure 4:
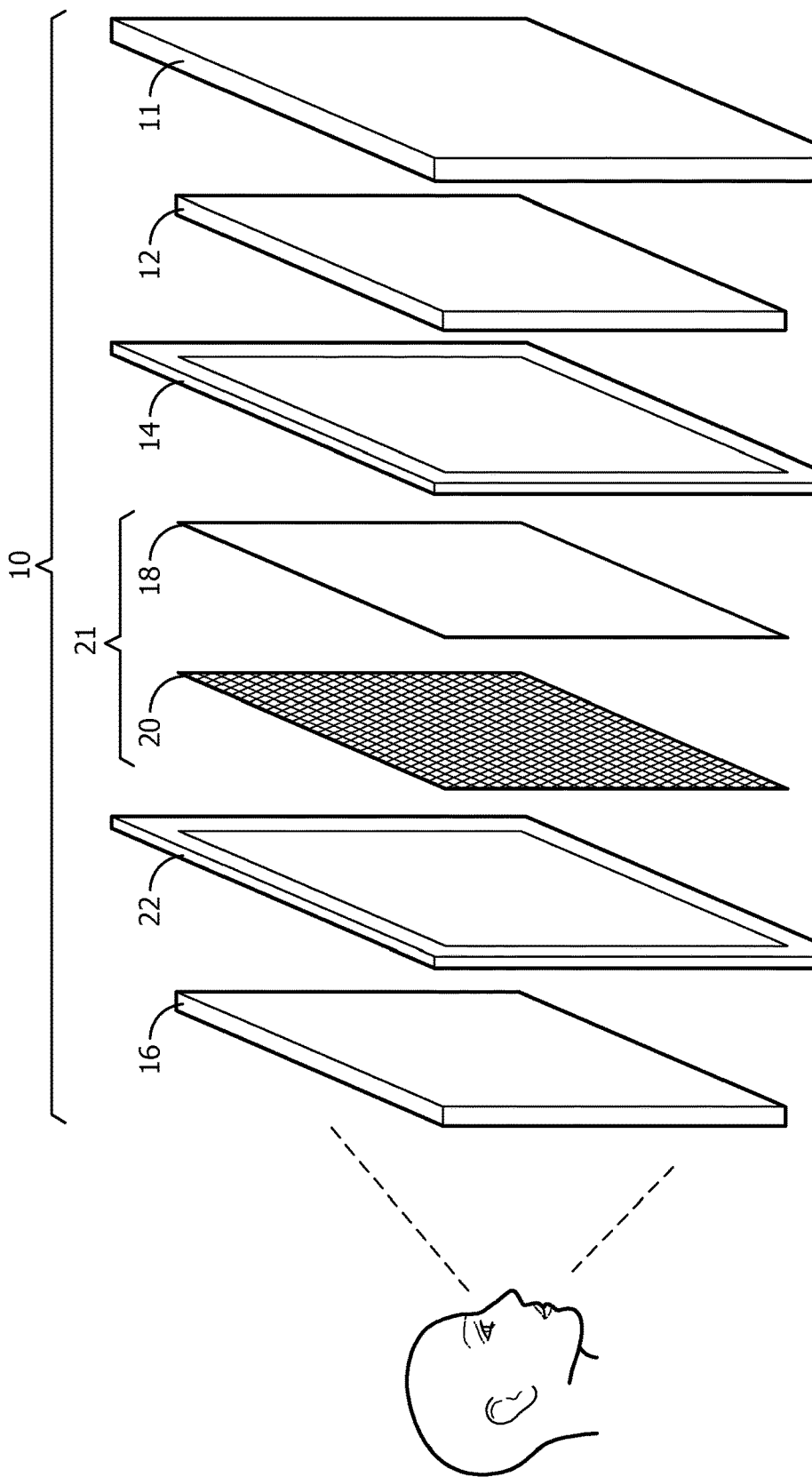

FIG. 4 schematically illustrates an expanded view of an embodiment of the MR safe touchscreen display.

Figure 5:
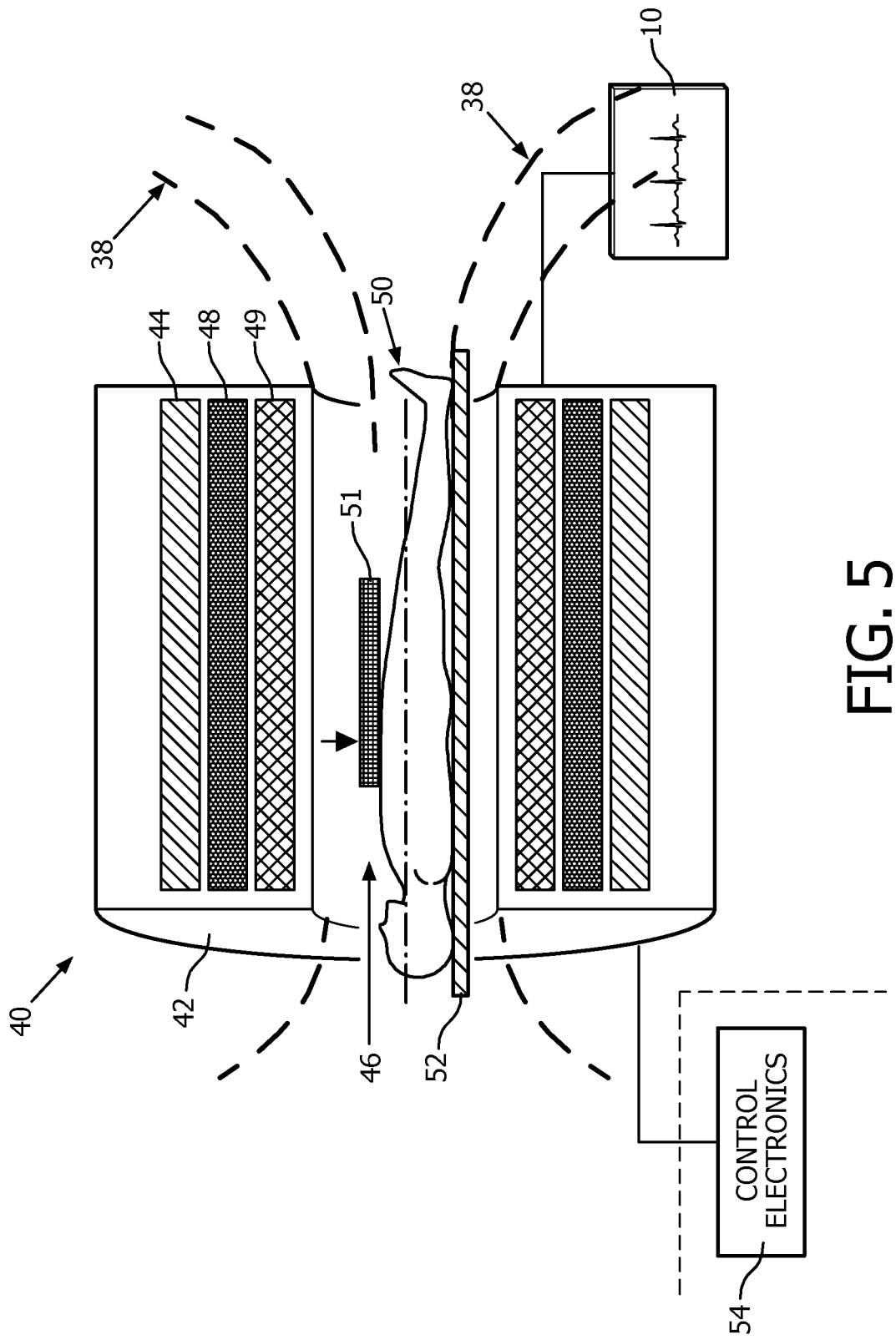

FIG. 5 schematically illustrates another embodiment of the MR safe touchscreen display with an MR scanner.

Figure 6:
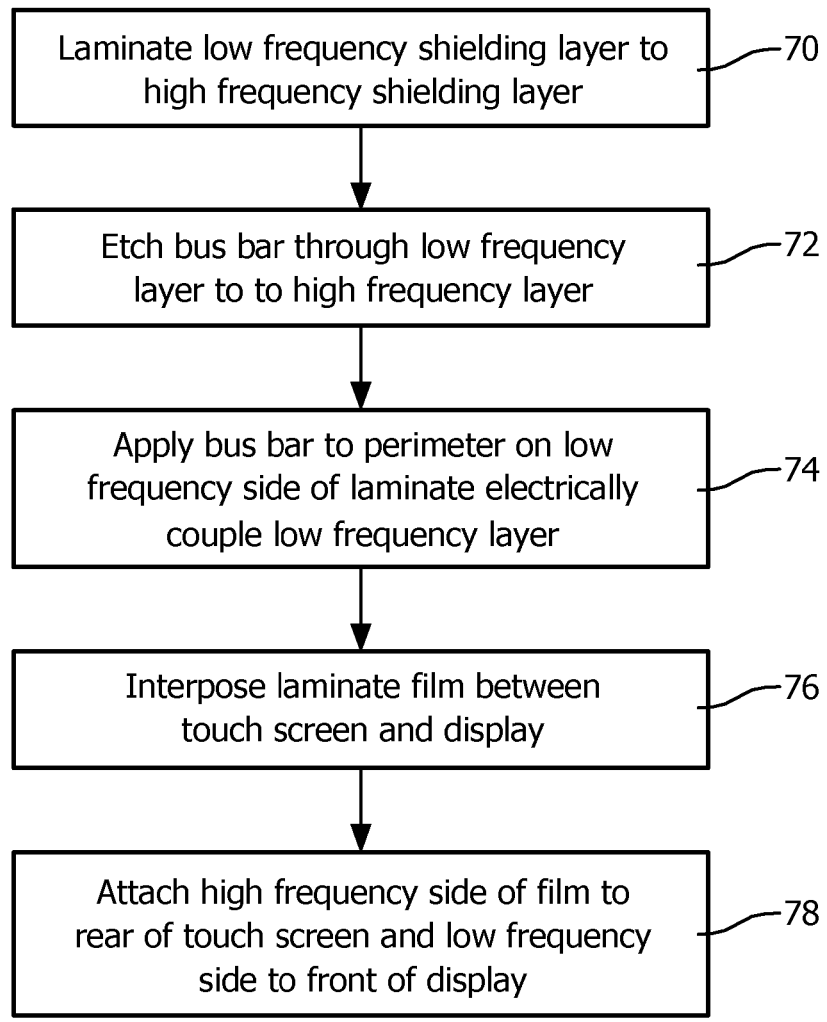

FIG. 6 flowcharts one method of manufacturing an embodiment of the MR safe touchscreen display.

With reference to FIGS. 1A-1B, a magnetic resonance (MR) safe touchscreen display 10 includes a display component 12, a bus bar 14 and a touchscreen 16 component. The bus bar 14 is conductively coupled to a low frequency shielding layer 18 and a high frequency shielding layer 20, as well as is in contact with a display mounting frame 22 of the touchscreen 16. In varying embodiments, a Faraday cage is formed by via a housing 11 of the display component 12 in electrical contact with the bus bar 14, as discussed in below.

The touchscreen 16 may be implemented as a resistive touchscreen, wherein two flexible sheets coated with a resistive material are separated via an air gap or physical separation component. Upon pressure from a user on the outer sheet, a circuit is formed with the inner sheet, which is then processed to determine the corresponding position on the display 12 intended to be touched by the user. Capacitive displays utilize a different mechanism, requiring specialized gloves, no gloves, or special pens for use. That is, a distortion caused by the human body (finger) via touching the specially coated glass surface of a capacitive touchscreen results in a distortion of the screen's electrostatic field, measured as a change in capacitance. This is then processed to determine the position on the display touched by the user. In accordance with the example implementation set forth herein, the touchscreen 16 is a resistive touchscreen, thereby enabling use in clinical settings, particularly an MR environment.

The touchscreen 16 is positioned within a display mounting frame 22, which functions to protect the edges of the screen 16, as well as to protect the space between the sheets of the screen 16 from environmental influences, e.g., moisture, dust, fingerprints, etc. The display mounting frame 22 generally is coupled to the housing 11 containing the display 10 and the internal components that enable the display 10 to function. According to one embodiment, the display 10 is a flat panel display, such as a light emitting diode (LED) display or a liquid crystal display (LCD). The display 10 may be implemented in any suitable size, including, for example, sizes in excess of 12 inches, 13 inches, 15 inches, etc., in diagonal.

The low frequency shielding layer 18 may comprise a low frequency shielding conductive component 26 and a film component 30. The high frequency shielding layer 20 may comprise a high frequency shielding conductive component 28 and a film component 32. Embodiments contemplated herein may utilize a single film component having the conductive components 26 and 28 on either side thereof. For example purposes, reference is made to each layer 18 and 20 having distinct film components 30, 32, however one of skill in the art will appreciate that a laminated film 21 comprising the layers 18 and 20 may also be utilized in accordance with the embodiments disclosed herein.

As depicted in FIG. 1A and illustrated more fully in FIG. 1B and FIGS. 2A-2B, the low frequency shielding layer 18, may comprise a conductive component 26 or the like on a film substrate 30, e.g., a polyethylene terephthalate (PET) film. The conductive component 26 may be a coating of a suitable conductive material applied to one side of the film substrate 30 that inhibits, e.g., blocks, low frequency emissions from internal components (not shown) of the display 12. In accordance with one embodiment, the conductive component 26 may comprise an indium-tin-oxide (ITO) material, which is applied to the film substrate 30 via any suitable application means. The ITO material comprising the coating on the film substrate 30 may be implemented having a resistance of less than 1.55 Ohms per square centimeter (10 Ohms per square inch).

The high frequency shielding layer 20, as depicted, may comprise a conductive component 28 or the like on a film substrate 32, e.g., a PET film. The conductive component 28 may be a coating of a suitable conductive material applied to one side of the film substrate 32 that inhibits, e.g., blocks, high frequency emissions from internal components (not shown) of the display 12. The conductive component 28 may be printed or formed within the film substrate 32 in various embodiments contemplated herein. In accordance with one embodiment, the conductive component 28 may comprise a copper mesh, which is printed or woven onto or embedded in the film substrate 32. The copper mesh forming the high frequency conductive component 28 may be of wires of various thickness but typically at 10 microns (0.000394 in.), and may be formed to have between 11 and 16 openings per square centimeter (70 and 100 openings per square inch), so as to prevent EMI radiation from the components in the housing 11, while not substantially impacting viewing of the display 12, e.g., woven mesh is typically 0.0022 in. (56 microns) thick intersections in the mesh are 0.0044 in. (112 microns) thick. According to one embodiment, the number of openings per square inch of the copper mesh forming the high frequency conductive component 28 may be adjusted in accordance with the size of the display 10 so as not to negatively or adversely affect the viewing thereof by an associated user. The orientation of the mesh may also be managed to avoid creating a moire effect. The layers of films 18 and 20 may be laminated together to form a laminated film component 21 of the MR safe touchscreen display 10. An anti-reflective (AR) coating (not shown) may be applied to the laminated film component 21, on both sides thereof, so as to reduce or offset any reflective issues resulting from the conductive layers 18 and 20.

The MR safe touchscreen display 10 depicted in FIGS. 1A-1B further illustrates the bus bar 14 that is conductively coupled to the low frequency shielding layer 18 and the high frequency shielding layer 20. The bus bar 14 is in contact with the display mounting frame 22 of the touchscreen 16 and in contact with the housing 11 of the display 12, thereby forming a Faraday cage of the internal components of the MR safe touchscreen display 10. As shown in FIGS. 1A-2, the bus bar 14 extends over the edges of layers 18, 20 to the front of the touchscreen 16, enabling contact with the display mounting frame 22. The bus bar 14 may comprise a silver acrylic compound that is printed, painted, or otherwise applied to the conductive side of layer 18 and extending along the edges of the layers 16, 18 and 20. The bus bar 14 may be comprised of a low resistivity silver compound having less than or equal to 0.0155 Ohms per square centimeter (0.1 Ohms per square inch). The bus bar 14 may be applied to the layer 18 at varying thickness in accordance with varying factors, e.g., size of screen, mesh utilized, thickness of films 30, 32, etc., and may be applied having a thickness of approximately 0.04 millimeters (approximately one-thousandth of an inch).

Laser etching 24 further improves contact amongst the conductive components 26 and 28 of the low frequency shielding layer 18 and the high frequency block layer 20, respectively. As illustrated in FIGS. 1A-1B, the etchings 24 starts at the low frequency shielding layer and extends through the low frequency shielding layer 18 to the conductive component 28 of the high frequency shielding layer 20. The etchings 24 are positioned around the perimeter of the film 21 and correspond to the position of the bus bar 14, which is applied over the etchings 24 to conductively couple the conductive components 26 and 28.

FIGS. 2A-2B illustrate a side view of several components of varying embodiments of the MR safe touchscreen display 10, including the bus bar 14, the touchscreen 16, the low frequency shielding layer 26, and the high frequency shielding layer 28. FIG. 2A illustrates an embodiment of the MR safe touchscreen display 10 that includes a conductive gasket environmental seal component 17 in contact with the bus bar 14 and positioned so as to effectively seal conductivity between the touchscreen 16 and the display 12 and/or housing 11. The seal 17 may be positioned around the edges of the various components, as illustrated in FIG. 2A, or around the perimeter of the bus bar 14 as shown in FIG. 2B. The seal 17 may be an O-ring seal (in contact with a portion of the bus bar 14), an extruded seal (around the perimeter of the bus bar 14), a co-extruded seal (around the perimeter of the bus bar 14), or the like. According to one embodiment, the seal 17 is comprised of a conductive material, allowing for the electrical connectivity of the bus bar 14 to the housing 11 of the display to form a Faraday cage around the components housed therein. In another embodiment, an environmental seal (not shown) may be utilized between the touchscreen 16, layers 18 and 20, and the display 12 to protect the internal components from moisture, dust, debris, solvents, or the like. Such an environmental seal may be implemented as rubber, plastic, silicon, or other suitable seal materials, functioning solely as an environmental protection component. FIG. 2B illustrates an embodiment of the MR safe touchscreen display 10 that includes a bezel component 19 positioned around the front face of the touchscreen 16 and extending inward toward the center of the touchscreen 16 a preselected distance. In several embodiments, the bezel 19 may be constructed of varying materials and of varying depths depending upon the application or environment in which the MR safe touchscreen display 10 is to be deployed. The bezel 19 may be positioned to overlap the outer edge of the touchscreen 16 to contact the housing 11 and thereby seal the various components of the touchscreen display 10 against the elements. In the embodiment of FIG. 2B, the bezel 19 may be a separate environmental seal, sealing the touchscreen 16 to the housing 11 so as to prevent fluids, dust, or the like, from breaching in to the internal components.

Referring now to FIG. 3, there is shown a rear view of the bus bar 14 around the perimeter of the layers 18, 20 according to one embodiment of the MR safe touchscreen display 10. FIG. 3 better illustrates the etchings 24 formed through the low frequency shielding layer 18 around the perimeter of the film 18, 20. The etchings 24 may be formed via laser, mechanically formed, acidic etching, or the like. The depiction in FIG. 3 further illustrates a slot 34 formed on one portion of the bus bar 14, as well as extending through both the low frequency shielding layer 18 and the high frequency shielding layer 20. According to one embodiment, the slot 34 is configured to enable a connecting cable, wire, or the like, from the rear of the touchscreen component 16 through the layers 18, 20, the display mounting frame 22 (when applicable) to connect to the display component 12 and internal components thereof contained within the housing 11.

With reference now to FIG. 4, there is shown an expanded view depicting one embodiment of the MR safe touchscreen display 10. As illustrated in FIG. 4, a user views through the touchscreen component 16, the high frequency shielding layer 20, the low frequency shielding layer 18 to the display component 12. That is, the high frequency shielding layer 20 may be laminated with the low frequency shielding layer 18, wherein the side of the laminated film 21 having the high frequency shielding layer 20 is adjacent to the rear of the touchscreen component 16 and the low frequency shielding layer 18 is adjacent the display component 12. The bus bar 14, as illustrated, enables contact between display mounting frame 22, the layers 18 and 20, and the housing 11, thereby forming a Faraday cage around the internal components of the display 12 and preventing electromagnetic interference from affecting operations of an MR scanner 40, as illustrated in FIG. 5. Application of the bus bar 14 may be accomplished via taping, printing, or the like, of the material to the layers 18 and 20, as discussed above.

With reference to FIG. 5, another embodiment of the magnetic resonance safe touchscreen display 10 is schematically illustrated in a magnetic resonance environment (depicted as the magnetic field 38) generated by a magnetic resonance (MR) scanner 40. The MR scanner 40 is shown in diagrammatic side-sectional view in FIG. 5, and includes a housing 42 containing a main magnet windings 44 (typically superconducting and contained in suitable cryogenic containment, not shown, although a resistive magnet windings are also contemplated) that generate a static ($B_0$) magnetic field in a bore 46 or other examination region. The housing 42 also contains magnetic field gradient coils 48 for superimposing magnetic field gradients on the static ($B_0$) magnetic field. Such gradients have numerous applications as is known in the art, such as spatially encoding magnetic resonance, spoiling magnetic resonance, and so forth. An imaging subject, such as an illustrative patient 50, or an animal (for veterinary imaging applications), or so forth is loaded into the examination region (inside the bore 46 in the illustrative case) via a suitable couch 52 or other patient support/transport apparatus. The MR scanner 40 may include numerous additional components known in the art which are not shown for simplicity, such as optional steel shims, a whole body radio frequency (RF) coil 49 disposed in the housing 42, and so forth. The MR scanner 40 also typically includes numerous auxiliary or ancillary components again not shown for simplicity, such as power supplies for the main magnet 44 and the magnetic field gradient coils 48, built-in RF coils 49, optional local RF coils 51 (e.g. surface coils, a head coil or limb coil, or so forth), RF transmitter and RF reception hardware, and various control and image reconstruction systems, by way of some examples. Moreover, it is to be understood that the illustrative MR scanner 40, which is a horizontal-bore type scanner, is merely an illustrative example and that more generally the disclosed MR safe touchscreen display 10 is suitably employed in conjunction with any type of MR scanner (e.g., a vertical bore scanner, open-bore scanner, or so forth).

As depicted in FIG. 5, the MR safe touchscreen display 10 is positioned in relative proximity to the MR scanner 40, such that the display 10 is operating within the magnetic resonance environment. As will be appreciated, the sensitivity of the MR scanner 40 requires low amounts of electromagnetic interference. The display 10, however, inclusive of the low frequency shielding layer 18 and the high frequency shielding layer 20 allows the larger display 10 to be positioned in close proximity to the MR scanner 40, thus enabling patient monitoring within the magnetic resonance environment. The display 10 may also be used for patient entertainment, entry of control and command functions communications, and the like.

Other elements of an MR system, such as control electronics 54, are generally located outside the magnetic resonance environment to protect the electronics 54 and to prevent interference from the electronics 54 adversely impacting operations of the MR scanner 40. Accordingly, as shown in FIG. 5, system further includes control electronics 54 in communication with the MR scanner 40 via assorted communications links including shielded cables, wireless communication links, or a combination thereof. The control electronics 54 are positioned in a remote location, shielded from the magnetic field 38 of the magnetic resonance environment generated by the MR scanner 40, as well as protecting the MR scanner 40 from electromagnetic interference generated by the various components of the control electronics 54. The system includes a sequence controller, an optical monitoring unit, and a Radio Frequency (RF) receiver unit. The sequence controller controls the operation of the imaging sequence which includes an RF transmitter unit controlling the operation of the RF coils 49, 51 and a gradient controller controlling the operation of the gradient coils 48. The communication between the control electronics 54 (i.e., the control components) and the corresponding coils 48, 49, 51 may be wireless or wired, e.g., the shielded cables or the like.

The RF transmitter unit may work cooperatively with the local coil 51 when configured as a transmit/receive coil. The RF receiver receives RF data from local coil indicative of the magnetic resonance excited in the tissue of the subject 50. The RF data can be communicated between the local coil 51, the coil 49, or the like, and the RF receiver wirelessly or via a wired connection. With a wireless connection, the power is used from an induced current or a separate power source to transmit RF data. With a wired connection, the wire can operationally supply power for amplification and carry the resonance signal. A reconstruction unit, such as a processor, receives the RF data from the RF receiver and reconstructs one or more images from the received data.

In operation, the main magnet 44 operates to generate a static $B_0$ magnetic field in the examination region 46. RF pulses are generated by the RF system (including for example a transmitter and one or more RF coils disposed in the bore or a whole-body RF coil in the housing 42) at the Larmor frequency (i.e., magnetic resonance frequency) for the species to be excited (usually protons, although other species may be excited, e.g. in MR spectroscopy or multinuclear MR imaging applications). These pulses excite nuclear magnetic resonance (NMR) in the target species (e.g., protons) in the subject 50 which are detected by a suitable RF detection system (e.g., a magnetic resonance coil or coils and suitable receiver electronics). Magnetic field gradients are optionally applied by the gradient coils 48 before or during excitation, during a delay period (e.g., time to echo or TE) period prior to readout, and/or during readout in order to spatially encode the NMR signals. The reconstruction unit applies a suitable reconstruction algorithm comporting with the chosen spatial encoding in order to generate a magnetic resonance image which may then be displayed, rendered, fused or contrasted with other MR images and/or images from other modalities, or otherwise utilized.

The various units or controllers are suitably embodied by an electronic data processing device(s), such as the electronic processor or electronic processing device, or by a network-based server computer operatively connected with the various units or controllers by a network, or so forth. Moreover, the disclosed reconstruction and system operation are suitably implemented as a non-transitory storage medium storing instructions (e.g., software) readable by an electronic data processing device and executable by the electronic data processing device to perform the disclosed reconstruction and system operation.

With reference to FIG. 6, one method for manufacturing an embodiment of the MR safe touchscreen display 10 is flowcharted. In a step 70, a low frequency shielding layer 18 is laminated to a high frequency shielding layer 20. The resulting laminated film 21 includes one side that has a high frequency shielding component 28, such as a copper mesh, and the other side having a low frequency shielding component 26, such as an ITO coating. The size of the film 21 is dependent upon the size of the MR safe touchscreen display 10 being manufactured. In one embodiment, laminating the two layers 18 and 20 may involve utilizing a single substrate, i.e., PET film, such that a copper mesh printed on the substrate film and the ITO coating is applied to the opposite side of the film. In another embodiment, each layer 18 and 20 includes the conductive components 26 and 28 applied to independent substrates 30 and 32, whereupon step 70 requires the laminating of these two layers 18 and 20 into a single laminated film 21.

In a step 72, etching, e.g., laser, acidic, mechanical, etc., is performed on the low frequency shielding component 26 (and film component 30, if applicable) through to the high frequency shielding component 28, around a perimeter of the laminated film 21, thereby exposing the high frequency shielding component 28 for conductive coupling therebetween. In one example embodiment, etching is performed through the ITO coating to the copper mesh (component 28) to allow the bus bar 14 to electrically couple the ITO coating (component 26) to the copper mesh (component 28). Such etching may increase the surface area of contact between the various components, thereby improving continuity therebetween.

In a step 74, a bus bar 14 is applied to the perimeter of one face of the laminated film 21 and along the edges of the laminated film 21, thereby contacting both the low frequency shielding component 26 and the high frequency shielding component 28 through the etchings 24 in the low frequency shielding layer 18. The bus bar 14 is generally affixed or applied to the face of the laminated film 21 having the low frequency shielding component 26, i.e., the face of the laminated film 21 on which the ITO was coated. The application at step 74 may include painting a conductive material around the edges and perimeter, or the application of a pre-formed layer of such material, e.g., silver, silver acrylic, tin foil, graphite, copper tape or other suitable conductive material. According to one embodiment, an anti-reflective coating is applied to one or both sides of the laminated film 21, either prior to application of the bus bar 14 or subsequent to application of the bus bar 14.

In a step 76, the laminated film 21 is interposed between the rear face of the touchscreen 16 and front face (the face that is viewed by a user) of the display 12. When interposed, the low frequency shielding layer 18 is positioned adjacent the front face of the display 12 and the high frequency shielding layer 20 is position adjacent the rear face of the touchscreen 16. The laminated film 21 is then attached to the corresponding faces of the touchscreen 16 and the display 12 at a step 78. In one embodiment, a seal 17 is affixed to the back of the touchscreen 16, e.g., a conductive O-ring in contact with a portion of the bus bar 14, an extruded or co-extruded conductive seal on the perimeter of the bus bar 14, or affixed along the edge of the bus bar 14 and touchscreen 16 (or display mounting frame 22) to conductively couple the touchscreen 16 to the housing 11 of the display 12 prior to the attachment thereof at step 78. According to another embodiment, a bezel 19 may be affixed to the front face of the touchscreen 16. Such a bezel 19 may function as an environmental seal of the touchscreen 16 to the housing 11 of the display 12, or the like.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

The invention claimed is:

1. A magnetic resonance (MR) safe touchscreen display, comprising:
    a touchscreen;
    a film including a high frequency shielding layer and a low frequency shielding layer-, the film being disposed adjacent to a rear face of the touchscreen- ;
    a bus bar conductively coupling the low frequency shielding layer to the high frequency shielding layer around a perimeter of a face of the film and a corresponding edge thereof; and
    an etching through the low frequency shielding layer and immediately proximate to the high frequency shielding layer, wherein the bus bar conductively couples the low frequency shielding layer to the high frequency shielding layer and to a display component adjacent the low frequency shielding layer in accordance with the etching.

2. The MR safe touchscreen display according to claim 1, wherein the bus bar is applied to the low frequency layer and extends through the etching to the high frequency layer so as to conductively couple the bus bar and the low frequency layer to the high frequency layer of the film.

3. The MR safe touchscreen display according to claim 1, wherein the high frequency shielding layer is positioned immediately adjacent the rear face of the touchscreen.

4. The MR safe touchscreen display according to claim 1, wherein the high frequency shielding layer comprises a copper mesh.

5. The MR safe touchscreen display according to claim 1, wherein the low frequency shielding layer includes indium tin oxide.

6. The MR safe touchscreen display according to claim 1, wherein the high and low frequency shielding layers are coated on polyethylene terephthalate films.

7. The MR safe touchscreen display according to claim 1, wherein the bus bar includes at least one of silver, silver acrylic, tin foil, copper or graphite.

8. The MR safe touchscreen display according to claim 1, further comprising a seal conductively coupling the bus bar to the housing of the display forming a Faraday cage.

9. A method for manufacturing a magnetic resonance (MR) safe touchscreen display, comprising:
    laminating a low frequency shielding layer film onto a high frequency shielding layer film to form a laminated film;
    etching the bus bar through the low frequency shielding layer to the high frequency shielding layer,
    applying a bus bar to the laminated film around a perimeter of the laminated film corresponding to the low frequency shielding layer to form a conductive coupling between the low frequency shielding layer to the high frequency shielding layer; and attaching the etched laminated film to a touchscreen adjacent the high frequency shielding layer and to a display component adjacent the low frequency shielding layer.

10. The method according to claim 9, wherein applying the bus bar further comprises painting a silver acrylic bus bar around the perimeter of the laminated film on a side having the low frequency shielding layer.

11. The method according to claim 9, further comprising interposing the laminated film between a rear face of the touchscreen and a front face of the display component.

12. A magnetic resonance (MR) safe touchscreen display, comprising:

a display mounting frame;

a touchscreen disposed within the display mounting frame;

a laminated film positioned adjacent the touchscreen and in contact with the display mounting frame and the touchscreen-, the laminated film including a high frequency shielding layer and a low frequency shielding layer, the laminated film having a plurality of etchings disposed along a perimeter thereof extending through the low frequency shielding layer to the high frequency shielding layer; and a bus bar conductively coupling the low frequency shielding layer to the high frequency shielding layer via the plurality of etchings and to the display mounting frame along an edge of the perimeter of the laminated film.

13. The MR safe touchscreen display according to claim 12, wherein the high frequency shielding layer comprises a copper mesh and the low frequency shielding layer comprises indium tin oxide.

14. The MR safe touchscreen display according to claim 12, further comprising a seal conductively coupling the bus bar to the housing of the display forming a Faraday cage.

* * * * *